United States Patent
Chang et al.

(10) Patent No.: US 12,297,104 B2
(45) Date of Patent: May 13, 2025

(54) SEMICONDUCTOR STRUCTURE AND FORMATION THEREOF

(71) Applicant: TAIWAN SEMICONDUCTOR MANUFACTURING COMPANY LIMITED, Hsin-Chu (TW)

(72) Inventors: Kai-Lan Chang, Tainan (TW); Yu-Lung Yeh, Kaohsiung (TW); Yen-Hsiu Chen, Tainan (TW); Shuo Yen Tai, Yongkang (TW); Yung-Hsiang Chen, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 767 days.

(21) Appl. No.: 17/458,711

(22) Filed: Aug. 27, 2021

(65) Prior Publication Data

US 2023/0067539 A1 Mar. 2, 2023

(51) Int. Cl.
*B81C 1/00* (2006.01)
*B81B 7/00* (2006.01)

(52) U.S. Cl.
CPC ........ *B81C 1/00333* (2013.01); *B81B 7/0058* (2013.01); *B81B 2201/0264* (2013.01); *B81B 2203/0315* (2013.01); *B81B 2203/0353* (2013.01); *B81B 2207/015* (2013.01); *B81C 2203/0136* (2013.01)

(58) Field of Classification Search
None
See application file for complete search history.

(56) References Cited

U.S. PATENT DOCUMENTS

| | | | |
|---|---|---|---|
| 8,941,218 | B1 | 1/2015 | Perkins et al. |
| 2012/0326248 | A1 | 12/2012 | Daneman et al. |
| 2013/0330878 | A1 | 12/2013 | Ararao |
| 2016/0254343 | A1* | 9/2016 | Zhang ............... H01L 28/24 |
| | | | 257/774 |
| 2017/0188413 | A1* | 6/2017 | Hsu ................. G01N 27/12 |
| 2021/0070612 | A1* | 3/2021 | Chang .............. B81C 1/00166 |
| 2021/0181039 | A1* | 6/2021 | Lupo ................. G01J 5/0011 |

FOREIGN PATENT DOCUMENTS

| CN | 108117038 A | 6/2018 |
|---|---|---|
| DE | 102017218635 A1 | 4/2019 |

OTHER PUBLICATIONS

First Office Action received in corresponding Chinese patent application No. 202210147462.0, dated Jul. 18, 2024, 12 pages.

* cited by examiner

Primary Examiner — Michelle Mandala
(74) Attorney, Agent, or Firm — Cooper Legal Group, LLC

(57) ABSTRACT

A method is provided that includes forming a first metal layer of a seal structure over a micro-electromechanical system (MEMS) structure and over a channel formed through the MEMS structure to an integrated circuit of a semiconductor structure. The first metal layer is formed at a first temperature. The method includes forming a second metal layer over the first metal layer. The second metal layer is formed at a second temperature less than the first temperature. The method includes performing a first cooling process to cool the semiconductor structure.

20 Claims, 9 Drawing Sheets

SEMICONDUCTOR STRUCTURE AND FORMATION THEREOF

BACKGROUND

Micro-electromechanical systems (MEMS) combine mechanical and electronic components on a semiconductor structure. A MEMS structure can be used as a sensor, such as a pressure sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
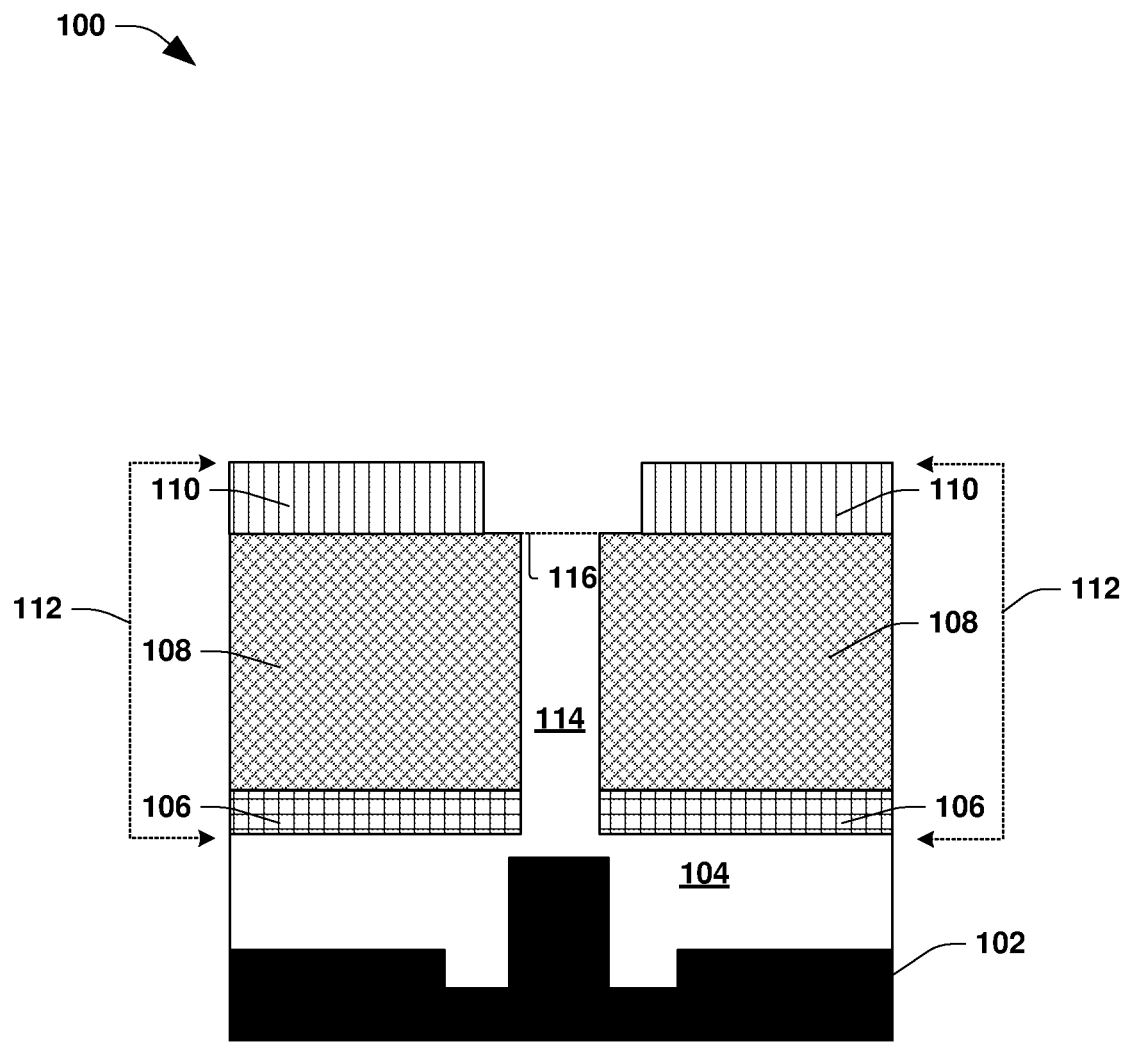
FIGS. 1-8 are cross-sectional views of a semiconductor structure with a seal structure at various stages of fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

One or more semiconductor structures with a seal structure and/or methods for creating semiconductor structures with a seal structure are provided. In some embodiments, a semiconductor structure comprises a micro-electromechanical system (MEMS) structure. A channel is formed through the MEMS structure to a cavity between the MEMS structure and an integrated circuit. In some embodiments, the integrated circuit detects changes to the cavity, such as changes in the volume of the cavity, changes in the pressure in the cavity, etc. The integrated circuit outputs a signal indicative of the detected changes.

During fabrication of the semiconductor structure, the channel is used to remove, such by vacuuming, creating a pressure differential, etc., content, such as air, one or more gasses, etc., from the cavity so that the cavity has a particular pressure, volume, etc. Once the content has been removed from the cavity through the channel, a seal structure is formed over the MEMS structure and channel. The seal structure is formed in order to seal off an active area of the MEMS structure, such as to seal off the cavity and other portions of the MEMS structure used to actively sense pressure. The active area of the MEMS structure is sealed off so that the active area of the MEMS structure can maintain the pressure in the cavity established when the content was removed from the cavity through the channel. Thus, sealing off the active area of the MEMS structure provides the ability to maintain a certain pressure within the active area of the MEMS structure, such as a pressure that is less than a pressure of an external environment that is external to the semiconductor structure. Keeping the relatively lower pressure within the active area of the MEMS structure will reduce noise of the MEMS structure and integrated circuit. Otherwise, the noise will adversely affect the performance and ability of the MEMS structure and the integrated circuit to sense changes in pressure.

In some embodiments, the seal structure comprises one or more metal layers. The one or more metal layers may be formed by at least one of sputtering, deposition, or other suitable processes. The one or more metal layers are formed over the MEMS structure and the channel in order to form the seal structure used maintain the pressure of the active area of the MEMS structure, such as the cavity. Heat can be utilized during the formation of the one or more metal layers, such as during sputtering. Increased temperature due to the heat utilized during the sputter process to form the seal structure can increase the temperature of the integrated circuit. The temperature increase of the integrated circuit causes the integrated circuit, such as a complementary metal oxide semiconductor (CMOS) film layer of the integrated circuit, to outgas. When the integrated circuit outgases, gas is emitted from the integrated circuit into the active area of the MEMS structure, such as the cavity, and into the channel. The gas travels from the integrated circuit up through the channel over which the seal structure is being formed. The greater the temperature, the more gas is produced by the integrated circuit. In order to escape from the active area of the MEMS structure, such as through the channel, pressure from the gas can create a leak path through the seal structure to an external environment in order to escape out into the external environment. Thus, the increased pressure from the gas can break through the seal structure to create the leak path.

When the increased pressure, from the integrated circuit outgassing due to the increase temperature, creates the leak path through the seal structure, air can now leak through the seal structure into and out of the channel. The leak path through the seal structure allows air exchange between the active area of the MEMS structure, such as the channel and the cavity, and the external environment. The pressure within the active area of the MEMS structure is affected by the air exchange, such as increased based upon the relatively higher pressure of the external environment. The change in pressure can increase noise of the MEMS structure and integrated circuit because the increase of pressure will increase the noise. In particular, the ability of the MEMS structure and the integrated circuit to accurately sense pressure changes without noise is improved when a lower pressure is maintained within the active area of the MEMS structure. Thus, the increased pressure will increase noise that will adversely affect the performance and ability of the MEMS structure and the integrated circuit to correctly sense changes in pressure.

Accordingly, as provided herein, the seal structure is formed by a process that utilizes relatively lower temperatures in order to reduce the likelihood of outgassing by the integrated circuit that could otherwise cause leak paths through the seal structure. In some embodiments, the relatively lower temperatures comprise temperatures between about 200 degrees Celsius to about 300 degrees Celsius. In some embodiments, the relatively lower temperatures comprise temperatures below 300 degrees Celsius. In some embodiments, a lower temperature is achieved by utilizing a relatively lower sputter power for a sputter process used to form one or more metal layers of the seal structure. In some embodiments, a metal layer of the seal structure is formed using a sputter power between about 6,000 watts to about 11,500 watts, as opposed to around 20,000 watts. Using the relatively lower sputter power can result in lower temperatures when forming the one or more metal layers of the seal structure. In some embodiments, an additional cooling process is performed during formation of a metal layer, such as where a cooling gas such as argon is flowed over the semiconductor structure during a sputter process to form the metal layer. In some embodiments, an additional cooling process is performed between the formation of one metal layer and another metal layer of the seal structure. In some embodiments, an additional cooling process is performed after the seal structure is formed. Implementing the one or more additional cooling processes can result in lower temperatures during formation of the seal structure.

Lowering the temperatures created during formation of the seal structure can reduce the likelihood that the integrated circuit will outgas. That is, heat will cause the integrated circuit to release gas. The higher the temperature, the more heat the integrated circuit will experience and the more gas the integrated circuit will release. The more gas released by the integrated circuit, the greater the pressure the gas will exert upon the seal structure, which can create leak paths. Thus, reducing the temperatures created during the formation of the seal structure will reduce the likelihood the integrated circuit will release gas into the active area of the MEMS structure, such as into the cavity and the channel. Reducing outgassing by the integrated circuit so that the integrated circuit does not release gas into the active area of the MEMS structure will reduce or eliminate the potential for leak paths through the seal structure. Otherwise, the additional pressure from the outgassing could break through the seal structure and cause a leak path between the active area of the MEMS structure and the external environment that would allow air exchange between the MEMS structure and the external environment. Thus, reducing or eliminating leak paths within the seal structure allows for the active area of the MEMS structure to maintain pressure for correct operation because there is little to no air exchange between the MEMS structure and the external environment through leak paths that otherwise could change the pressure in the active area of the MEMS structure. The ability to maintain the pressure of the active area of the MEMS structure improves, among other things, the operation, lifespan, and performance of the MEMS structure, such as the ability to accurately detect pressure changes. The operation, lifespan, and performance of the MEMS structure is improved because the pressure may be maintained within the active area of the MEMS structure, such as a pressure less than a pressure of the external environment.

According to some embodiment, a seal structure is formed from one or more metal layers at processing temperatures that reduce or eliminate outgassing that would otherwise result in leak paths through the seal structure. A first metal layer of the seal structure is formed over a MEMS structure and over a channel formed through the MEMS structure to an integrated circuit of a semiconductor structure. In some embodiments, the first metal layer is formed at a first temperature. In some embodiments, the first metal layer is formed by a first sputter process with a first sputter power. In some embodiments, a cooling gas, such as argon, is used to cool the semiconductor structure during the formation of the first metal layer. A second metal layer of the seal structure is formed over the first metal layer. In some embodiments, the second metal layer is formed at a second temperature that is less than the first temperature used to form the first metal layer. In some embodiments, the second metal layer is formed by a second sputter process with a second sputter power that is greater than the first sputter power used to form the first metal layer. After the second metal layer is formed, a cooling process is performed to cool the semiconductor structure. Forming the first metal layer using the lower first sputter power and using the cooling gas during the formation of the first metal layer reduces the amount of heat that the integrated circuit will experience, and thus reduces the likelihood of the integrated circuit outgassing. Furthermore, forming the second metal layer using the lower temperature and performing the cooling process after the second metal layer is formed reduces the amount of heat that the integrated circuit will experience, and thus reduces the likelihood of the integrated circuit outgassing. In some embodiments, one or more additional metal layers of the seal structure can be formed over the second metal layer of the seal structure using various temperatures, cooling processes, and sputter powers for reducing heat experienced by the integrated circuit.

FIGS. 1-8 are cross-sectional views of a semiconductor structure 100 with a seal structure 702 at various states of fabrication, according to some embodiments.

Referring to FIG. 1, the semiconductor structure 100 comprises an MEMS structure 112. The MEMS structure 112 comprises one or more layers, such as a first layer 106. In some embodiments, the first layer 106 comprises an oxide material. The MEMS structure 112 comprises a second layer 108. In some embodiments, the second layer 108 comprises a semiconductor material, such as polysilicon. In some embodiments, the second layer 108 is a pressure port used for sensing pressure. The MEMS structure 112 comprises a third layer 110. In some embodiments, the third layer 110 comprises an oxide material. It may be appreciated that the MEMS structure 112 can be a pressure sensor or any other type of MEMS sensor, and can comprise any number layers comprising any types of materials.

The MEMS structure 112 is positioned over a cavity 104. The cavity 104 initially comprises air, gas, a vacuum, or other content. The content of the cavity 104 is subsequently removed by a vacuum process performed through a channel 114. The channel 114, such as an air channel or a vacuum channel, is formed through the MEMS structure 112 to the cavity 104. The channel 114 is formed through the third layer 110 of the MEMS structure 112. The channel 114 is formed through the second layer 108 of the MEMS structure, such that a top opening 116 of the channel 114 is parallel to where the third layer 110 overlies the second layer 108. The vacuum process is performed to remove the content of the cavity 104 and the channel 114 through the top opening 116 of the channel 114 so that the cavity 104 and the channel 114 have a particular pressure. In this way, content, such as air or gas, is vacuumed out of the cavity 104 through the channel 114 and the top opening 116. In some embodiments, the content is vacuumed out to vent pressure in the cavity 104 to a particular mTorr pressure while the semiconductor structure 100 is within a physical vapor deposition transfer chamber.

The MEMS structure 112 is formed over an integrated circuit 102. In some embodiments, the integrated circuit 102 is configured to detect how pressure sensed by the MEMS structure 112 affects the cavity 104. When pressure, such as from an external or ambient environment relative to the MEMS structure 112, acts upon the MEMS structure 112, the MEMS structure 112, such as the first layer 106, the second layer 108, and/or the third layer 110, etc., deforms based upon the applied pressure. When the MEMS structure 112 deforms, the shape of the cavity 104 changes. For example, the pressure causes the first layer 106 of the MEMS structure 112 to push down or deflect towards the integrated circuit 102, and thus reduce a volume of the cavity, increase a pressure within the cavity 104, etc. Depending on the type of MEMS structure 112, when the cavity 104 is deformed, the integrated circuit 102 can detect the deformation, such as a change in pressure, a change voltage, etc., and outputs a readout signal based upon the deformation of the cavity 104. It may be appreciated that various types of MEMS structures may be utilized, such as a MEMS pressure sensor configured to detect light detection and ranging (LIDAR) signals, in some embodiments. The integrated circuit 102 comprises a CMOS film layer. The CMOS film layer of the integrated circuit 102 can outgas gas in response to heat, which releases gas into the cavity 104. The gas from the integrated circuit 102 outgassing can travel up the channel 114 and release into an external environment outside of the semiconductor structure 100. If the integrated circuit 102 outgasses during or after formation of the seal structure 702 due to heat produced during the formation of the seal structure 702, then pressure from the gas attempting to escape through the seal structure 702 will create leak paths through the seal structure 702. Accordingly, as provided herein, the seal structure 702 is formed at reduced temperatures, such as temperature between about 200 degrees Celsius to about 300 degrees Celsius, in order to reduce the likelihood of outgassing so that few to no leak paths are created through the seal structure 702 due to pressure from gas otherwise created from outgassing in response to heat.

Figure 2:
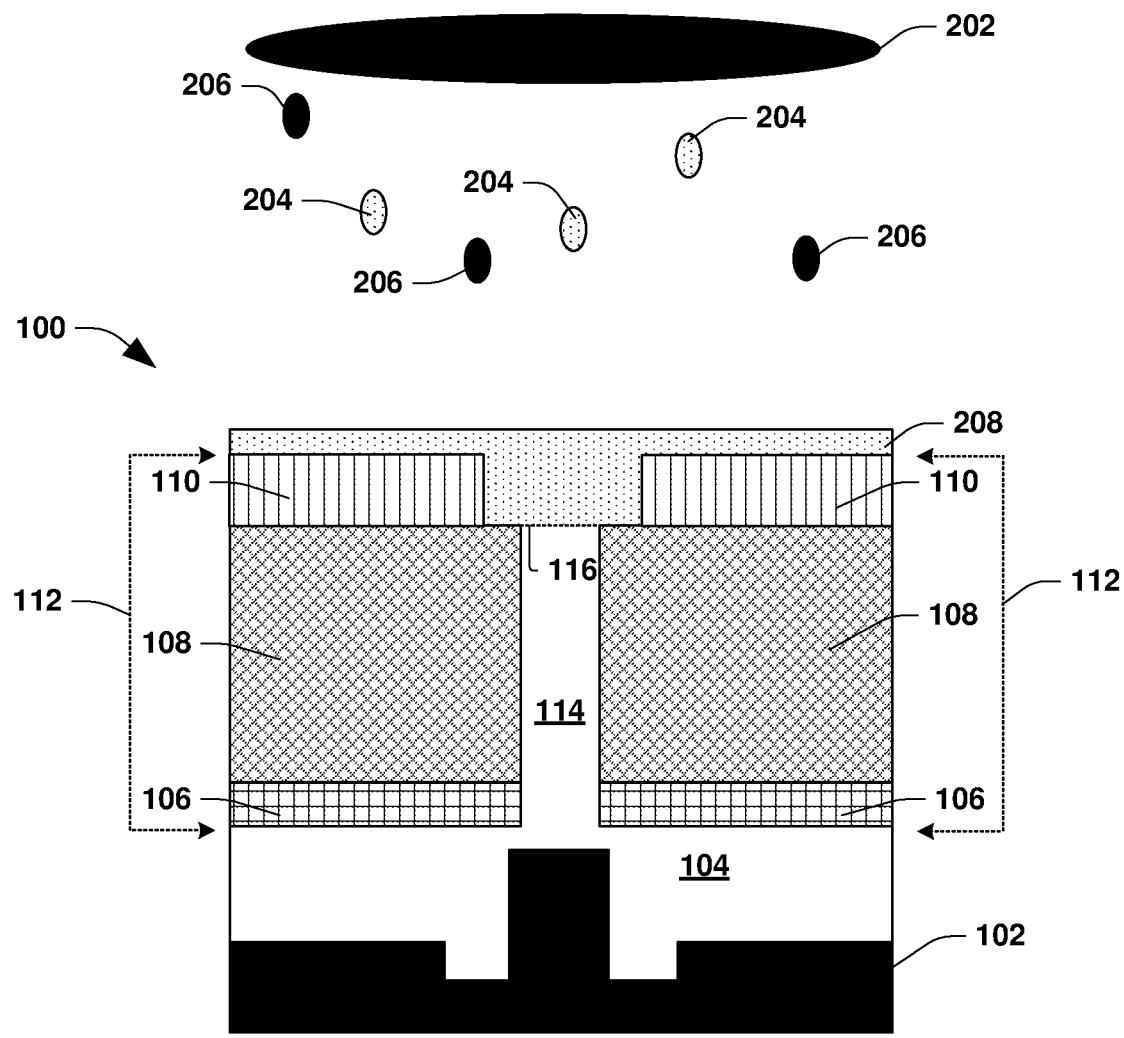

Referring to FIG. 2, in some embodiments a first metal layer 208 of the seal structure 702 is formed over the MEMS structure 112 and over the channel 114 that is formed through the MEMS structure 112 to the cavity 104 and the integrated circuit 102. In some embodiments, the first metal layer 208 is formed such that the first metal layer 208 is formed over the top opening 116 of the channel 114, but not into the top opening 116 and down into the channel 114 and over the integrated circuit 102. The first metal layer 208 is formed over the third layer 110 of the MEMS structure 112. In some embodiments, the first metal layer 208 is formed over at least some of the second layer 108 of the MEMS structure 112, such as where portions of the second layer 108 of the MEMS structure 112 are not covered by the third layer 110 of the MEMS structure 112. In some embodiments, the semiconductor structure 100 is cooled to room temperature, such as between about 20 degrees Celsius to about 30 degrees Celsius, before formation of the first metal layer 208. As part of cooling the semiconductor structure 100, a degas lamp, used to degas the channel 114 and the cavity 104 to vacuum out and remove content such as air and gas from the channel and the cavity 104, is turned off to reduce heat otherwise generated by the degas lamp that could raise a temperature of the semiconductor structure 100 to a temperature greater than room temperature.

In some embodiments, the first metal layer 208 is formed by at least one of a first sputter process, a first deposition process, etc., such as by implementing a physical vapor deposition apparatus 202. The physical vapor deposition apparatus 202 operates to form first metal material 204 over the MEMS structure 112 and over the channel 114 to form the first metal layer 208. In some embodiments, the first metal layer 208 is formed at a first temperature. In some embodiments, the first temperature is between about 200 degrees Celsius to about 300 degrees Celsius. In some embodiments, the first sputter process utilizes a first sputter power. In some embodiments, the first sputter power is between about 6,000 watts to about 11,500 watts. In some embodiments, the first sputter power is less than about 20,000 watts. In some embodiments, the first sputter power is less than a threshold in order to reduce heat otherwise emitted during the first sputter process if a higher sputter power was otherwise utilized. Reducing the heat emitted during the first sputter process by utilizing the first sputter power enables the first metal layer 208 to be formed at the first temperature.

In some embodiments, the semiconductor structure 100 is cooled with a cooling gas 206 during and/or after the formation of the first metal layer 208. In some embodiments, the cooling gas 206 comprises argon. Argon may be used because of the relatively large size of argon atoms and/or molecules in order to adequately cool the semiconductor structure 100 during and/or after the formation of the first metal layer 208. Utilizing the cooling gas 206 enables the first metal layer 208 to be formed at the first temperature. In some embodiments, the first metal layer 208 comprises trace amounts of cooling gas, such as argon, used to cool the first metal layer 208.

In some embodiments, the first metal layer 208 is formed with a first resistivity. In some embodiments, the first resistivity of the first metal layer 208 is between about 2.00E-08 $\Omega\cdot$m to about 4.00E-08 $\Omega\cdot$m. In some embodiments, the first metal layer 208 comprises an aluminum copper alloy. In some embodiments, the aluminum copper alloy comprises between about 20% to about 30% copper material and between about 80% to about 70% aluminum material. In some embodiments, the aluminum copper alloy comprises about 25% copper material and about 75% aluminum material. According to some embodiments, at least some of the foregoing properties, characteristics, etc. of the first metal layer 208, such as formation at a particular temperature, formation using a particular power, formation with a particular cooling gas, formation to have a particular resistivity, formation to comprise particular material(s), etc., are important, at least, for the first metal layer 208 to function as desired, such as to form a desired seal, have a desired flexibility, such as for movement in response to changes in pressure, such as changes in pressure external to the MEMS structure 112, to inhibit outgassing of the integrated circuit 102, etc.

Figure 3:
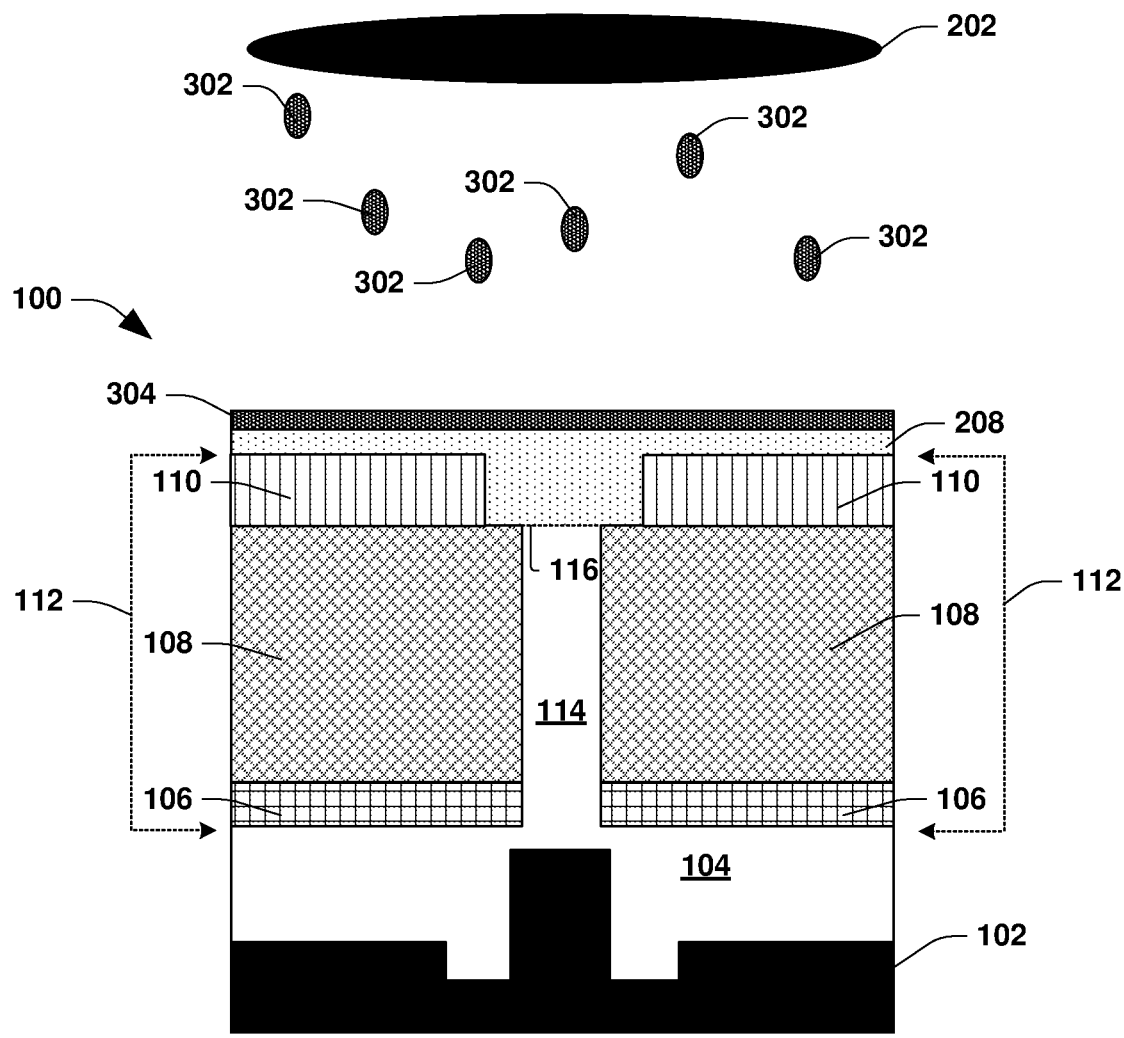

Referring to FIG. 3, in some embodiments a second metal layer 304 of the seal structure 702 is formed over the first metal layer 208. In some embodiments, the second metal layer 304 is formed by at least one of a second sputter process, a second deposition process, etc., such as by implementing the physical vapor deposition apparatus 202. The physical vapor deposition apparatus 202 operates to form second metal material 302 over the first metal layer 208 to form the second metal layer 304. In some embodiments, the second metal layer 304 is formed at a second temperature. In some embodiments, the second temperature used to form the second metal layer 304 is less than the first temperature used to form the first metal layer 208. In some embodiments, the second temperature is between about 200 degrees Celsius to about 250 degrees Celsius.

In some embodiments, the second sputter process utilizes a second sputter power. In some embodiments, the second sputter power is greater than the first sputter power. In some embodiments, the second sputter power is greater than about 11,500 watts. In some embodiments, the second sputter power is about 20,000 watts.

In some embodiments, the second metal layer 304 is formed with a second resistivity. In some embodiments, the second resistivity of the second metal layer 304 is different than the first resistivity of the first metal layer 208. In some embodiments, the second resistivity of the second metal layer 304 is between about 1.00E-07 Ω·m to about 1.00E-06 Ω·m. In some embodiments, the second metal layer 304 comprises a titanium nitride material.

Figure 4:
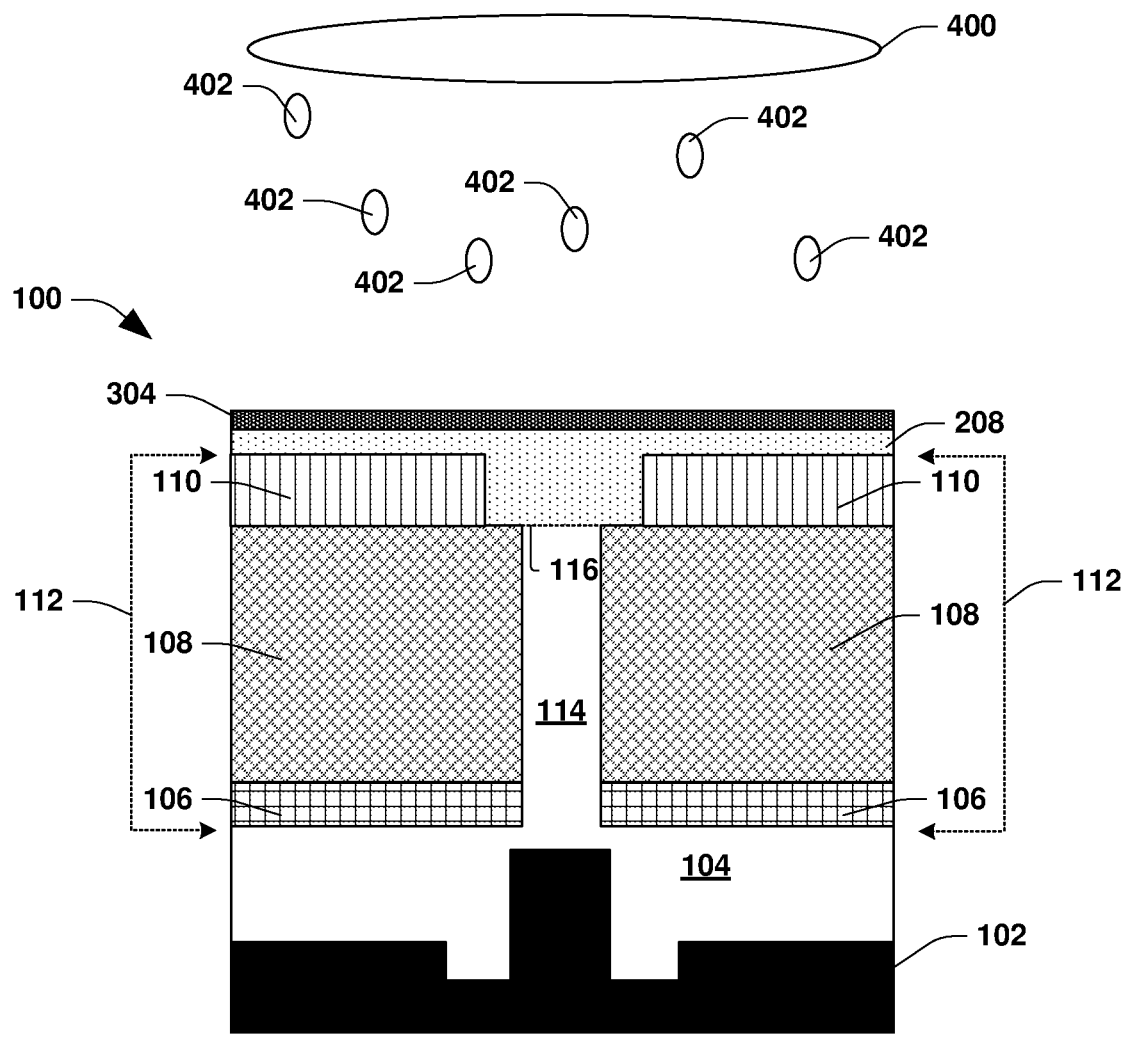

Referring to FIG. 4, in some embodiments a first cooling process is performed to cool the semiconductor structure 100. In some embodiments, the first cooling process is performed after the second metal layer 304 is formed over the first metal layer 208. The first cooling process is performed by an apparatus 400 configured to flow a cooling material, such as a cooling gas 402, over the semiconductor structure 100. In an embodiment, the apparatus 400 flows the cooling gas 402 over the second metal layer 304 formed over the first metal layer 208. In some embodiments, the cooling gas comprises at least one of nitrogen or argon. In some embodiments, the first cooling process is performed for a timespan between about 120 seconds to about 220 seconds. In some embodiments, the first cooling processed is performed by the apparatus 400 for about 180 seconds. In some embodiments, the first cooling process is performed to cool the semiconductor structure 100 to between about 15 degrees Celsius to about 30 degrees Celsius. In some embodiments, the first cooling process is performed to cool the semiconductor structure 100 to around room temperature, such as around 20 degrees Celsius. According to some embodiments, at least some of the foregoing properties, characteristics, etc. of the second metal layer 304, such as formation at a particular temperature, formation using a particular power, formation with a particular cooling gas, formation to have a particular resistivity, formation to comprise particular material(s), etc., are important, at least, for the second metal layer 304 to function as desired, such as to form a desired seal, have a desired flexibility, such as for movement in response to changes in pressure, such as changes in pressure external to the MEMS structure 112, to inhibit outgassing of the integrated circuit 102, etc.

Figure 5:
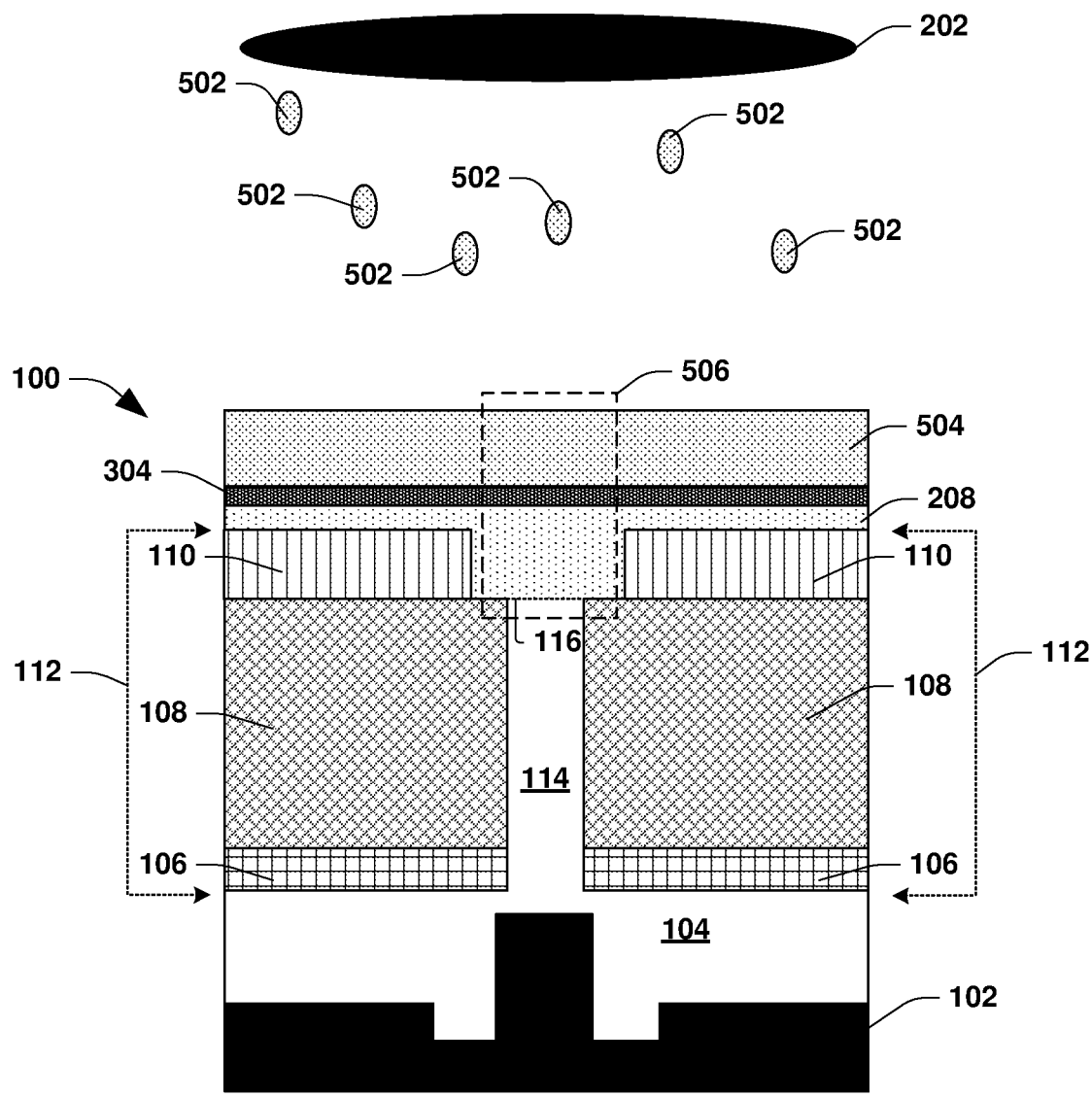

Referring to FIG. 5, in some embodiments a third metal layer 504 of the seal structure 702 is formed over the second metal layer 304. In some embodiments, the third metal layer 504 is formed by at least one of a third sputter process, a third deposition process, etc., such as by implementing the physical vapor deposition apparatus 202. The physical vapor deposition apparatus 202 operates to form third metal material 502 over the second metal layer 304 to form the third metal layer 504. In some embodiments, the third metal layer 504 is formed at a third temperature. In some embodiments, the third temperature used to form the third metal layer 504 is similar to the first temperature used to form the first metal layer 208. In some embodiments, the third temperature used to form the third metal layer 504 is greater than the second temperature used to form the second metal layer 304. In some embodiments, the third temperature is between about 200 degrees Celsius to about 300 degrees Celsius.

In some embodiments, the third sputter process utilizes a third sputter power. In some embodiments, the third sputter power is similar to the second sputter power. In some embodiments, the third sputter power is greater than the first sputter power. The third sputter power is larger than the first sputter power to form the third metal layer 504 at a rate faster than a rate at which the first metal layer 208 is formed. In some embodiments, the third sputter power is greater than about 11,500 watts. In some embodiments, the third sputter power is about 20,000 watts.

In some embodiments, the third metal layer 504 is formed with a third resistivity. In some embodiments, the third resistivity of the third metal layer 504 is different than the second resistivity of the second metal layer 304. In some embodiments, the third resistivity of the third metal layer 504 is similar to the first resistivity of the first metal layer 208. In some embodiments, the third resistivity of the third metal layer 504 is between about 2.00E-08 Ω·m to about 4.00E-08 Ω·m. In some embodiments, the third metal layer 504 comprises an aluminum copper alloy. In some embodiments, the aluminum copper alloy comprises between about 20% to about 30% copper material and between about 80% to about 70% aluminum material. In some embodiments, the aluminum copper alloy comprises about 25% copper material and about 75% aluminum material.

A grain size of a metal material of a metal layer of the seal structure 702 is a factor of, among other things, parameters associated with forming the metal material, such as temperature at which the metal layer is formed from the metal material. In some embodiments, the metal material will have a smaller grain size if a lower temperature is used, as compared to the grain size of the metal material if a higher temperature is used. The grain size corresponds to an average grain diameter of the grains (crystals) of the metal material of the metal layer. In some embodiments, the third metal material 502 of the third metal layer 504 has a grain size that is smaller than a grain size of the first metal layer 208, such as in a region 506 over the top opening 116 of the channel 114. In some embodiments, a grain size of a metal material of a metal layer of the seal structure 702 is about 2.01 μm. According to some embodiments, at least some of the foregoing properties, characteristics, etc. of the third metal layer 504, such as formation at a particular temperature, formation using a particular power, formation with a particular cooling gas, formation to have a particular resistivity, formation to comprise particular material(s), formation to have a particular grain size, etc., are important, at least, for the third metal layer 504 to function as desired, such as to form a desired seal, have a desired flexibility, such as for movement in response to changes in pressure, such as changes in pressure external to the MEMS structure 112, to inhibit outgassing of the integrated circuit 102, etc.

Figure 6:
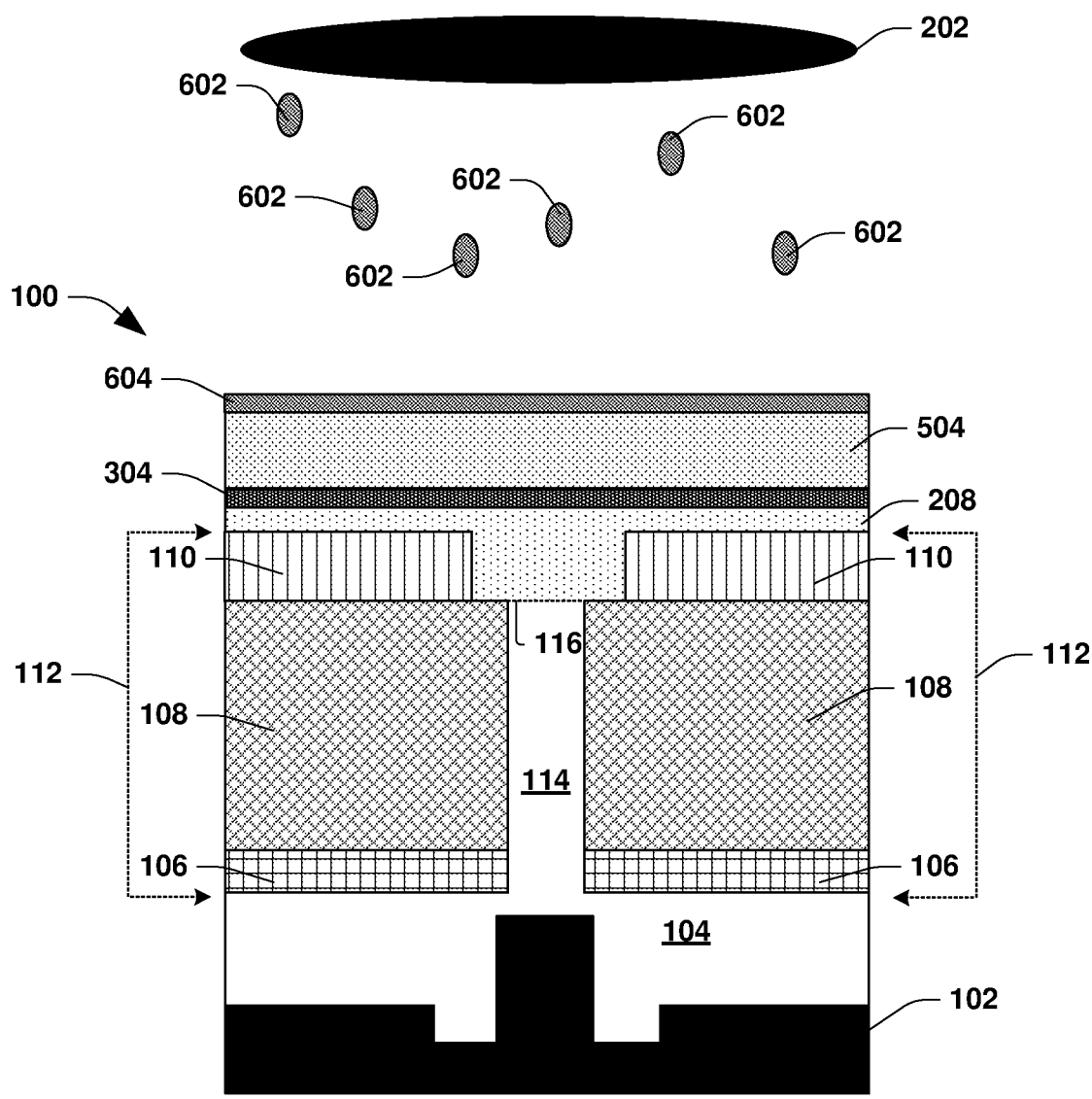

Referring to FIG. 6, in some embodiments a fourth metal layer 604 of the seal structure 702 is formed over the third metal layer 504. In some embodiments, the fourth metal layer 604 is formed by at least one of a fourth sputter process, a fourth deposition process, etc., such as by implementing the physical vapor deposition apparatus 202. The physical vapor deposition apparatus 202 operates to form fourth metal material 602 over the third metal layer 504 to form the fourth metal layer 604. In some embodiments, the fourth metal layer 604 is formed at a fourth temperature. In some embodiments, the fourth temperature used to form the fourth metal layer 604 is less than the first temperature used to form the first metal layer 208. In some embodiments, the fourth temperature is between about 200 degrees Celsius to about 250 degrees Celsius.

In some embodiments, the fourth sputter process utilizes a fourth sputter power. In some embodiments, the fourth sputter power is greater than the first sputter power. In some embodiments, the fourth sputter power is greater than about 11,500 watts. In some embodiments, the fourth sputter power is about 20,000 watts.

In some embodiments, the fourth metal layer 604 is formed with a fourth resistivity. In some embodiments, the fourth resistivity of the fourth metal layer 604 is different than the first resistivity of the first metal layer 208. In some embodiments, the fourth resistivity of the fourth metal layer 604 is between about 1.00E-07 Ω·m to about 1.00E-06 Ω·m. In some embodiments, the fourth metal layer 604 comprises a titanium nitride material.

In some embodiments, a second cooling process is performed to cool the semiconductor structure 100. In some embodiments, the second cooling process is performed after the fourth metal layer 604 is formed. It may be appreciated that the seal structure 702 may be formed with any number of metal layers, such as four metal layers, fewer than four metal layers, or more than four metal layers. In some embodiments, if the seal structure 702 has more or fewer metal layers than four metal layers, then the second cooling process may be performed to cool the semiconductor structure 100 after a final metal layer of the seal structure 702 has been formed. Various cooling techniques may be performed to cool the semiconductor structure 100, such as flowing a cooling gas, such as at least one of nitrogen or argon, over the semiconductor structure 100. In some embodiments, the second cooling process is performed to cool the semiconductor structure 100 to a temperature between about 20 degrees Celsius to about 30 degrees Celsius. According to some embodiments, at least some of the foregoing properties, characteristics, etc. of the fourth metal layer 604, such as formation at a particular temperature, formation using a particular power, formation with a particular cooling gas, formation to have a particular resistivity, formation to comprise particular material(s), etc., are important, at least, for the fourth metal layer 604 to function as desired, such as to form a desired seal, have a desired flexibility, such as for movement in response to changes in pressure, such as changes in pressure external to the MEMS structure 112, to inhibit outgassing of the integrated circuit 102, etc.

Figure 7:
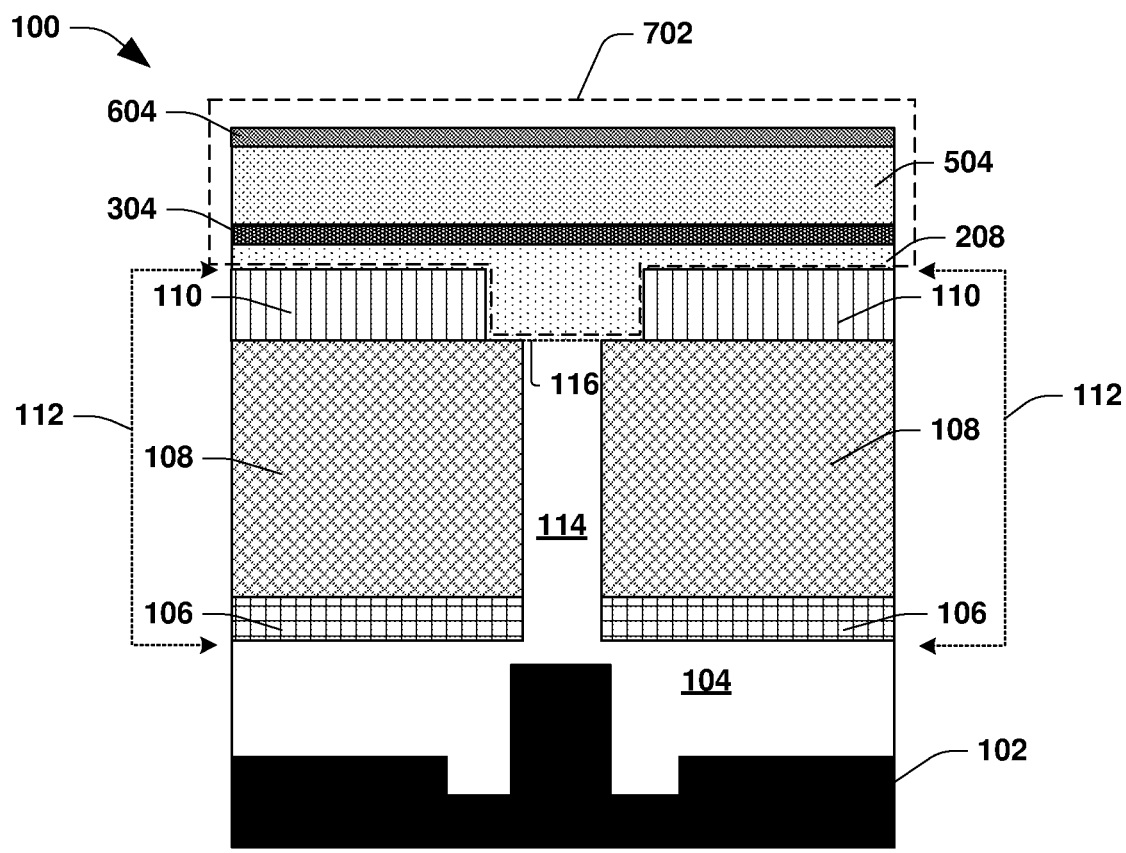

Referring to FIG. 7, the seal structure 702 is depicted as comprising the first metal layer 208, the second metal layer 304, the third metal layer 504, and the fourth metal layer 604, according to some embodiments. In some embodiments, the seal structure 702 comprises fewer than four metal layers. In some embodiments, the seal structure 702 comprises more than four metal layers.

Figure 8:
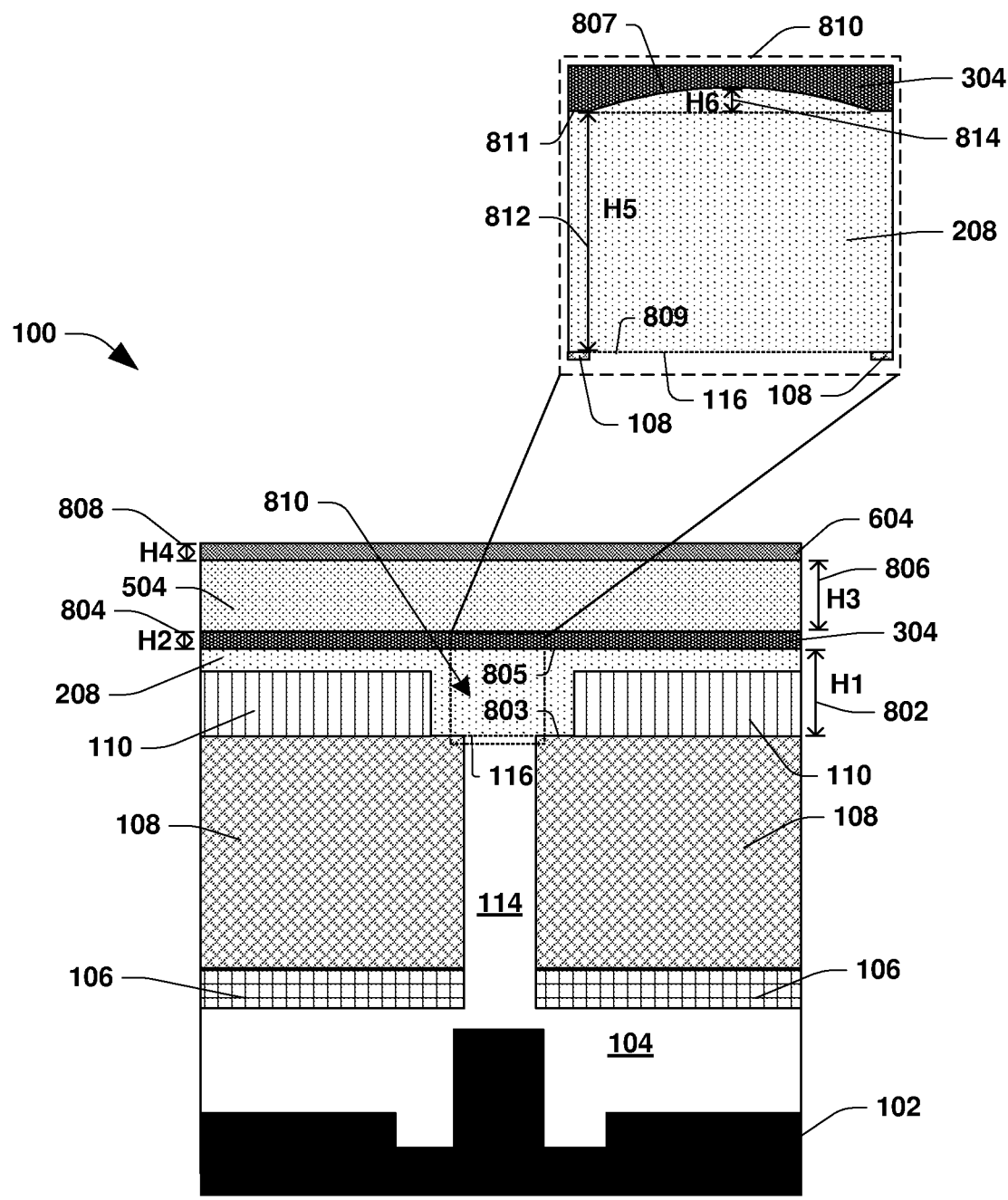

Referring to FIG. 8, in some embodiments the first metal layer 208 of the semiconductor structure 100 has a height (H1) 802 between about 10,000 angstroms to about 20,000 angstroms. In some embodiments, the height (H1) 802 of the first metal layer 208 is about 15,000 angstroms. The height (H1) 802 may be measured from an uppermost surface 803 of the second layer 108 of the MEMS structure 112 to a bottommost surface 805 of the second metal layer 304. The second metal layer 304 has a height (H2) 804 between about 1,000 angstroms to about 1,500 angstroms. The third metal layer 504 has a height (H3) 806 between about 10,000 angstroms to about 20,000 angstroms. In some embodiments, the height (H3) 806 of the third metal layer 504 is about 15,000 angstroms. The fourth metal layer 604 has a height (H4) 808 between about 250 angstroms to about 500 angstroms.

FIG. 8 illustrates a zoomed-in view of a region 810 over the channel 114. The zoomed-in view of the region 810 illustrates how an uppermost surface 807 of the first metal layer 208 overlying the channel 114 has a non-uniform or non-planar shape, according to some embodiments. The first metal layer 208 has a first region height (H5) 812 from a bottommost surface 809 of the first metal layer 208 to an overlying uniform or planar surface 811 of the first metal layer 208. The first metal layer 208 has a second region height (H6) 814 from the planar surface 811 of the first metal layer 208 to the apex of the uppermost surface 807 of the first metal layer 208. In some embodiments, the first metal layer 208 has a second region height (H6) 814 to first region height (H5) 812 ratio that is less than about 0.30 over the channel 114, such as about 0.25, such as due to the formation processes, characteristics, etc., such as temperatures, pressures, etc., associated with forming at least one of the first metal layer 208, the second metal layer 304, etc. According to some embodiments, the forgoing characteristics, dimensions, shapes, etc. facilitate desired performance, such as with regard to sealing, flexibility, etc.

Figure 9:
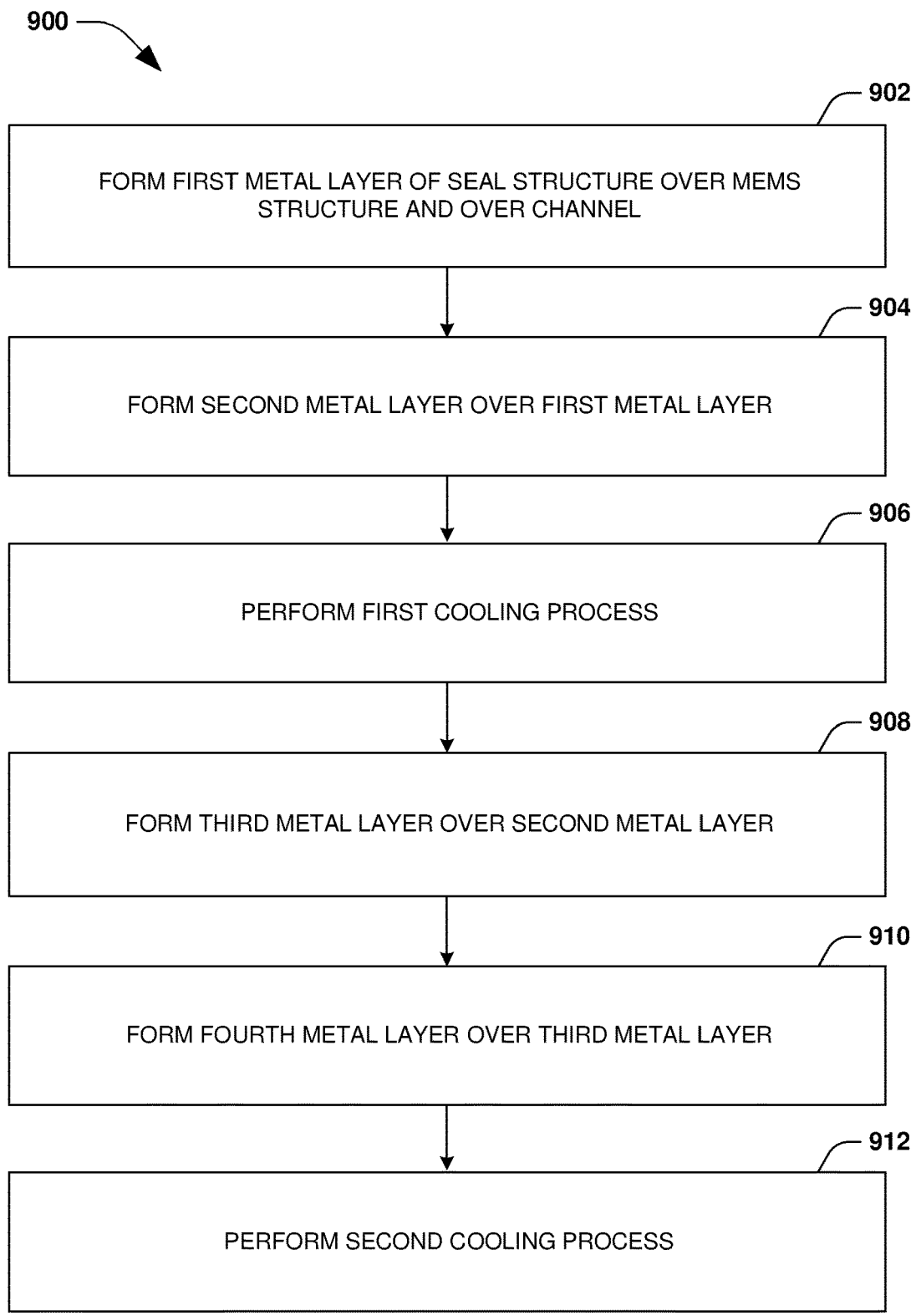
FIG. 9 is an illustration of a method of forming a semiconductor structure with a seal structure, according to some embodiments.

FIG. 9 is an illustration of a method 900 of forming a seal structure for a semiconductor structure, according to some embodiments. The method 900 comprises forming a first metal layer of the seal structure over a micro-electromechanical system (MEMS) structure and over a channel formed through the MEMS structure to an integrated circuit of the semiconductor structure (902). According to some embodiments, the first metal layer of the seal structure is formed at a first temperature. According to some embodiments, the first metal layer of the seal structure is formed using a first sputter process with a first sputter power. In an embodiment, a cooling process is performed during and/or after the formation of the first metal layer of the seal structure. A second metal layer of the seal structure is formed over the first metal layer (904). According to some embodiments, the second metal layer of the seal structure is formed at a second temperature less than the first temperature. According to some embodiments, the second metal layer of the seal structure is formed using a second sputter process with a second sputter power greater than the first sputter power. A first cooling process is performed to cool the semiconductor structure (906). A third metal layer of the seal structure is formed over the second metal layer of the seal structure (908). A fourth metal layer of the seal structure is formed over the third metal layer of the seal structure (910). A second cooling process is performed to cool the semiconductor structure (912).

The seal structure is formed utilizing processes that use relatively lower temperatures, such as where at least some metal layers of the seal structure are formed at temperatures between about 200 degrees Celsius to about 300 degrees Celsius. The lower temperatures are achieved by utilizing relatively lower sputter powers and cooling processes during formation of at least some metal layers of the seal structure, and by performing one or more cooling processes after formation of metal layers of the seal structure. Because the seal structure is formed at the relatively lower temperatures, the integrated circuit within the semiconductor structure experiences less heat than if higher temperatures were used. Lowering the heat experienced by the integrated circuit reduces outgassing of gases by the integrated circuit that could otherwise cause leak paths through the seal structure that allow air exchange between an external environment and a cavity connected to the channel. Reducing or eliminating leak paths through the seal structure allows the cavity to maintain a certain pressure that allows for the MEMS structure and integrated circuit to better sense pressure changes. In this way, at least one of the operation, lifespan, or performance of the MEMS structure is improved because a desired pressure is maintained within the cavity.

According to some embodiments a method includes forming a first metal layer of a seal structure over a micro-electromechanical system (MEMS) structure and over a channel formed through the MEMS structure to an integrated circuit of a semiconductor structure. The first metal layer is formed at a first temperature. A second metal layer is formed over the first metal layer. The second metal layer is formed at a second temperature less than the first temperature. A first cooling process is performed to cool the semiconductor structure.

According to some embodiments a method includes performing a first sputter process with a first sputter power to form a first metal layer of a seal structure over a micro-electromechanical system (MEMS) structure and over a channel formed through the MEMS structure to an integrated circuit of a semiconductor structure. A second sputter process is performed with a second sputter power greater than the first sputter power to form a second metal layer over the first metal layer. A first cooling process is performed to cool the semiconductor structure.

According to some embodiments a semiconductor structure comprises an integrated circuit. The semiconductor structure comprises a micro-electromechanical system (MEMS) structure, wherein a channel is formed through the MEMS structure to the integrated circuit. The semiconductor structure comprises a seal structure over the channel, wherein the seal structure comprises a first metal layer and a second metal layer over the first metal layer. The first metal layer has a first resistivity different than a second resistivity of the second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   forming a first metal layer of a seal structure over a micro-electromechanical system (MEMS) structure and over a channel formed through the MEMS structure to an integrated circuit of a semiconductor structure, wherein the first metal layer is formed at a first temperature, the first metal layer is formed to have a first resistivity, and the first metal layer is formed to have a first region height to second region height ratio less than 0.25 over the channel;
   forming a second metal layer of the seal structure over the first metal layer, wherein the second metal layer is formed at a second temperature less than the first temperature and is formed to have a second resistivity different than the first resistivity; and
   performing a first cooling process to cool the semiconductor structure.

2. The method of claim 1, wherein forming the first metal layer comprises:
   cooling the semiconductor structure with a cooling gas.

3. The method of claim 2, wherein the cooling gas comprises argon.

4. The method of claim 1, wherein:
forming the first metal layer comprises performing a first sputter process with a first sputter power;
forming the second metal layer comprises performing a second sputter process with a second sputter power; and
the first sputter power is less than the second sputter power.

5. The method of claim 1, wherein the first resistivity is between about 2.00E-08 Ω·m to about 4.00E-08 Ω·m.

6. The method of claim 1, wherein the second resistivity is between about 1.00E-07 Ω·m to about 1.00E-06 Ω·m.

7. The method of claim 1, comprising:
forming a third metal layer over the second metal layer, wherein the third metal layer is formed at a third temperature greater than the second temperature.

8. The method of claim 7, wherein:
forming the first metal layer comprises performing a first sputter process with a first sputter power;
forming the third metal layer comprises performing a second sputter process with a second sputter power; and
the first sputter power is less than the second sputter power.

9. The method of claim 7, comprising:
forming a fourth metal layer over the third metal layer.

10. The method of claim 9, wherein:
forming the first metal layer comprises performing a first sputter process with a first sputter power;
forming the fourth metal layer comprises performing a second sputter process with a second sputter power; and
the first sputter power is less than the second sputter power.

11. The method of claim 9, comprising:
performing a second cooling process to cool the semiconductor structure after forming the fourth metal layer.

12. A semiconductor structure, comprising: an integrated circuit;
a micro-electromechanical system (MEMS) structure, wherein a channel is formed through the MEMS structure to the integrated circuit; and
a seal structure over the channel, wherein the seal structure comprises a first metal layer and a second metal layer over the first metal layer, the first metal layer has a first resistivity different than a second resistivity of the second metal layer, and the first metal layer has a first region height to second region height ratio less than 0.25 over the channel.

13. The semiconductor structure of claim 12, wherein the seal structure comprises a third metal layer over the second metal layer, and wherein a grain of the first metal layer is larger than a grain of the third metal layer.

14. The semiconductor structure of claim 12, wherein the first resistivity is between about 2.00E-08 Ω·m to about 4.00E-08 Ω·m and the second resistivity is between about 1.00E-07 Ω·m to about 1.00E-06 Ω·m.

15. The semiconductor structure of claim 12, wherein the channel is void of material.

16. The semiconductor structure of claim 12, wherein the first metal layer has a convex surface overlying the channel.

17. A semiconductor structure, comprising: an integrated circuit;
a micro-electromechanical system (MEMS) structure, wherein a channel is formed through the MEMS structure to the integrated circuit; and
a seal structure over the channel, wherein the seal structure comprises a first metal layer, a second metal layer over the first metal layer, and a third metal layer over the second metal layer, wherein the first metal layer has a first resistivity different than a second resistivity of the second metal layer, and a grain of the first metal layer is larger than a grain of the third metal layer.

18. The semiconductor structure of claim 17, wherein the first metal layer has a convex surface overlying the channel.

19. The semiconductor structure of claim 17, wherein the first resistivity is between about 2.00E-08 Ω·m to about 4.00E-08 Ω·m and the second resistivity is between about 1.00E-07 Ω·m to about 1.00E-06 Ω·m.

20. The semiconductor structure of claim 17, where the seal structure comprises a fourth metal layer over the third metal layer.

* * * * *